United States Patent
Hwang et al.

(10) Patent No.: US 7,454,535 B2
(45) Date of Patent: Nov. 18, 2008

(54) BIDIRECTIONAL DATA REPEATER SWITCH

(75) Inventors: Julie A Hwang, Richardson, TX (US); Woo Jin Kim, Dallas, TX (US); Alan S Bass, Plano, TX (US); Mark W Morgan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/745,539

(22) Filed: May 8, 2007

(65) Prior Publication Data

US 2008/0001625 A1 Jan. 3, 2008

Related U.S. Application Data

(60) Provisional application No. 60/747,105, filed on May 12, 2006.

(51) Int. Cl.
*G06F 3/00* (2006.01)
*G06F 5/00* (2006.01)

(52) U.S. Cl. .............................. 710/51; 710/52; 370/75; 370/315; 370/492

(58) Field of Classification Search ................... 370/75, 370/226, 243, 246, 315, 492, 50; 375/211–215; 710/36, 51–52
See application file for complete search history.

(56) References Cited

U.S. PATENT DOCUMENTS 5,629,931 A 5/1997 Kausel 6,952,750 B2 * 10/2005 Cheung et al. .............. 710/305
2001/0038674 A1 * 11/2001 Trans ......................... 375/355

OTHER PUBLICATIONS

Gai-tronics, Model IRC300A Repeater Controller Installation and Service Manual, Pub. 43004-028A, Gai-tronics Corporation, Jan. 31, 20005, entire document.
"Comparing Bus Solutions," Texas Instruments Application Report, SLLA067, Mar. 31, 2000 (Alicke, et al.), entire document.
"PCA7517: Level Translating I2C -Bus Repeater," Philips Semiconductors, Oct. 5, 2004, pp. 2-13.

* cited by examiner

*Primary Examiner*—Rexford Barnie
*Assistant Examiner*—Jason Crawford
(74) *Attorney, Agent, or Firm*—Warren L. Franz; Wade J. Brady, III; Frederick J. Telecky, Jr.

(57) ABSTRACT

A bidirectional repeater and data multiplexer for serial data has A-side I2C port devices A1-A4 coupled to comparators 302-308 and pulldowns to ground 316-322. Comparator outputs are coupled responsive to select lines S1-S4 of N:1 Select 310 to terminal A1 of bidirectional control 210 to control pulldown to non-zero low voltage Vp 206 at B-side device B. An inverting comparator 208 coupled to terminal B1 of bidirectional control 210 responds to input threshold voltage Vt less than low voltage Vp, to prevent data lockup due to data flowback to devices A1-A4. Output data from comparator 208 is coupled responsive to select lines S1-S4 of 1:N Select 312 to control pulldowns 316-322. This selectively repeats routing of device A1-A4 data to device B. Data from device B is selectively routed to pulldowns of devices A1-A4.

6 Claims, 5 Drawing Sheets

BIDIRECTIONAL DATA REPEATER SWITCH

This application claims priority, under 35 U.S.C. § 119(e)(1), of U.S. Provisional Application No. 60/747,105, entitled "Bidirectional Data Repeater Switch," and having as its inventors Julie Hwang, Woo J. Kim, Alan S. Bass and Mark W. Morgan, filed May 12, 2006, and hereby incorporated herein by this reference.

BACKGROUND OF THE INVENTION

1. Field of the Invention

This invention relates generally to bidirectional serial data buses, and more specifically to bidirectional repeating, switching, and multiplexing of data signals on a serial bus without the need for pass-gates.

2. Description of the Related Art

A commonly used bidirectional serial data bus used for inter-integrated circuit communication is known as I2C. Each device transmitting and/or receiving data to or from the bus has an input/output (I/O) terminal coupled to a line of the data bus. Within a first such device, the I/O terminal is coupled to the drain or collector of an active pulldown transistor (hereinafter referred to as active pulldown) having its source or emitter grounded and a comparator. The comparator has a threshold voltage typically midway between logic "low" and logic "high" voltages so as to differentiate between a received low state and high state. Data to be transmitted to another device is coupled to the gate or base of the active pulldown in the first device, such that a logic "low" turns on the active pulldown causing a low voltage on the bus. During a logic "high", the active pulldown is off, and the passive pullup on the bus causes a high voltage on the bus. When the first device is receiving data, its active pulldown is off, and data received from the other device is compared in the first device to the threshold voltage, and appears as a logic "high" or "low" at the output of the comparator. The passive pullup on the bus provides a logic "high" when the active pulldowns of all devices on the bus are off.

Each device and each bus line also has parasitic capacitance, shown for convenience in figures discussed in this document as capacitors to ground at each I/O node, but in fact distributed throughout the bus structure. The high-to-low transition speed of data on the bus is primarily affected by the on resistance of the active pulldown and this parasitic capacitance, while the low-to-high transition speed is primarily affected by the passive pullup resistance and the parasitic capacitance. The cumulative parasitic capacitance on the bus increases as more devices are added to the bus and as the bus length increases, further slowing transitions. Similarly, the output data low level Vol is a function of the on resistance of the active pulldown at the transmit device and the combined resistance of the passive pullups on the bus.

When it is desired to couple data to/from two or more devices to a next device, often referred to as multiplexing the data signals, switched passgates are typically used to control which of the plurality of devices has access to the bus at a given time. These passgates are often implemented with metal oxide semiconductor field effect transistors (MOSFETs) having source and drain coupled in series with each signal line to be multiplexed. The passgate transistor in the signal line which has access to the bus is turned on, providing a low-resistance path for the data, while the passgates on the other lines remain off.

The non-zero on resistance of the passgate, however, further slows the rise and fall times of the data transitions, due to the parasitic capacitance at the I/O terminals of each device and parasitic capacitance of the bus itself. The voltage drop across this on resistance also lowers the input high voltage Vih and raises the input low voltage Vil appearing at the next device, thus decreasing the noise margin by reducing the peak to peak data voltage swing. Passgates also typically cannot isolate capacitance from one section of the bus to another.

It is desirable therefore to have a bidirectional repeater which isolates the parasitic capacitance between sections of the bus in a non-multiplexed or pass-gate multiplexed system. It is also desirable to have adjustability of some parameters of such a bidirectional repeater, to optimize its operation dependent on what type of logic it is coupled to. Further, it is desirable to have an alternate multiplexing mechanism eliminating passgates, and having capacitance isolation from device to device and reduced voltage drop across the multiplexing element, for improved noise margin.

SUMMARY OF THE INVENTION

The invention is a bidirectional repeater that couples first A and next B bidirectional data lines, and includes a first inverting comparator with an input coupled to the first data line A, having a comparator threshold typically midway between logic "high" and logic "low" voltages. The repeater includes a first active pulldown with its gate coupled to the output of the first inverting comparator, its source coupled to a voltage Vp which is non-zero but low enough to reliably appear as a logic "low" to the device on data line B, and its drain coupled to data line B. Also included is a second inverting comparator with an input coupled to data line B, having a threshold Vt that is lower than Vp but high enough to reliably differentiate between logic "high" and logic "low" from the device coupled to data line B. A second active pulldown has its gate coupled to the output of the second inverting comparator, its source coupled to ground, and its drain coupled to data line A.

Because the pulldown voltage Vp of the first active pulldown is above the threshold voltage Vt of the second inverting comparator, the second inverting comparator ignores the data low state passing from the first data line A to the second data line B. When the device on the second data line B outputs a logic "low" to data line B, however, the voltage on data line B goes below the threshold voltage of the second inverting comparator, causing the data low state to pass from the data line B to the data line A. The "A" side of the bidirectional repeater thus appears as a standard I2C input/output to logic coupled to it, and therefore maintains full noise margins. The "B" side of the repeater, having a non-zero pulldown voltage and threshold voltage lower than typical, has reduced noise immunity compared to the "A" side, but lockup is avoided by utilizing these modified pulldown Vp and threshold Vt voltages on the "B" side.

An embodiment of the invention facilitates adjustment of one or both of pulldown voltage Vp and threshold voltage Vt in the bidirectional repeater described above. Depending on the type of device connected to the "B" side of the repeater, voltages Vp and Vt are selected from a plurality of such voltages to optimize data transmission and reception to that device, while maximizing noise immunity. The plurality of pulldown and threshold voltages in a preferred embodiment are generated by a resistive ladder, and the desired pulldown voltage Vp and threshold voltage Vt, respectively, are coupled through switches to the first active pulldown and to the second inverting comparator as described above, responsive to selection inputs to these switches.

Another embodiment of the invention provides N to 1 multiplexing of N data lines A1, A2, . . . An to a data line B, without the need for passgates and their inherent limitations described above. In a preferred embodiment, the second active pulldown and first inverting comparator described above are replaced by a plurality of such active pulldowns and inverting comparators. Each of the N data lines A1 . . . An has coupled to it an active pulldown to ground, and each is also coupled to the input of an inverting comparator having a threshold between logic "high" and logic "low" voltages. The N outputs of these inverting comparators are coupled to an N:1 selection logic, whose output is coupled, responsive to one or more select signals, to the first input of a bidirectional control circuit. A first output of the bidirectional control circuit is coupled to the gate of a first active pulldown, as described above, with pulldown voltage of Vp, and the drain of this active pulldown is coupled to bus B. Bus B is also coupled to the input of an inverting comparator with threshold Vt lower than voltage Vp, and the comparator output is coupled to the input of 1:N selection logic. Responsive to one or more select signals, which are the same as those controlling the N:1 selection logic, the output of this comparator is thus coupled to one of the N outputs and hence to one of the respective gates of the plurality of active pulldowns coupled to the plurality of bus A lines. When it is desired to couple, for example, data line A3 to data line B, the N:1 selection logic couples the output of the comparator having data A3 as input to the bidirectional control circuit, while the 1:N selection logic couples the output of the bidirectional control circuit to the active pulldown coupled to data line A3. The bidirectional control circuit senses which of its inputs first transitions to logic "low", and then precludes data flow in the opposite direction until the end of this logic "low" transmission.

The elimination of passgates in embodiments described herein provides an integrated switching and repeater function with capacitance isolation, and reduces or eliminates the added series resistance on the bus.

As further described below, the disclosed embodiments provide a combination of desirable properties not available in the known art. Further benefits and advantages will become apparent to those skilled in the art to which the invention relates.

DESCRIPTION OF THE VIEWS OF THE DRAWINGS

Throughout the drawings, like elements are referred to by like numerals.

DETAILED DESCRIPTION

Figure 1:
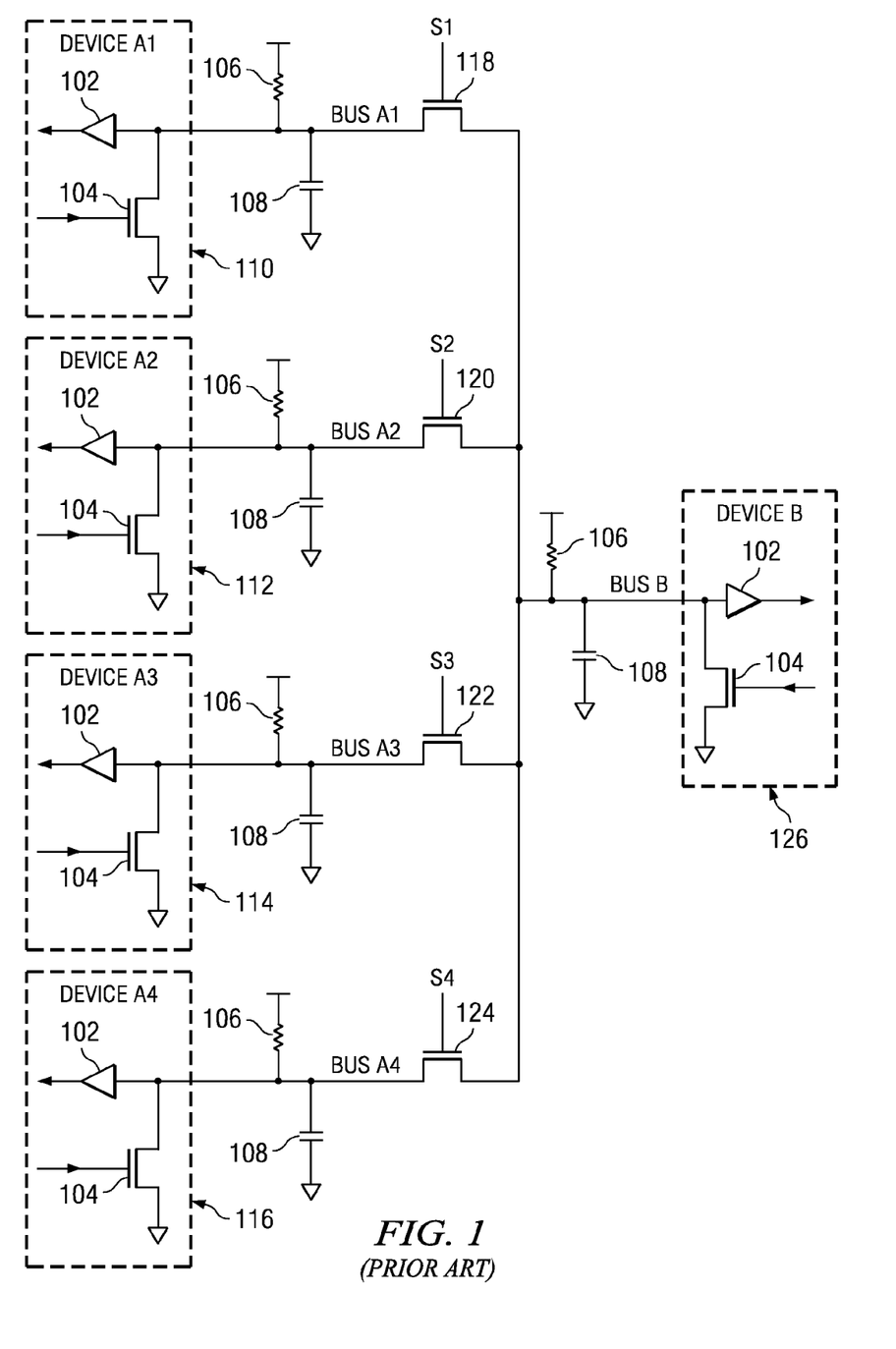
FIG. 1 (prior art) is a block diagram of a 4 to 1 bidirectional multiplexer using passgates.

In FIG. 1 (prior art), a plurality of devices A1, A2, . . . , An, shown as devices 110, 112, 114, 116, couple data to and from respective buses A1, A2, . . . , An to a common bus B and hence to device 126. In each device a comparator 102, with threshold set at an appropriate level typically midway between logic "high" and logic "low" voltages, has its input coupled to the respective A bus. An active pulldown 104 has its gate coupled to the data input of the device, and causes the bus to be pulled to a low voltage (typically ground) when the input transmit data line is high (while not shown, typically an inverter is placed in the line driving the gate of each active pulldown to compensate for the data inversion which otherwise takes place). The on resistance of active pulldown 104 is typically much lower than the passive pullup 106 so as to provide as low a logic "low" voltage as practical. Passive pullup 106 applies a logic "high" voltage to the bus when active pulldown 104 is off. Capacitance 108 is typically parasitic capacitance of the bus and the device I/O, which slows the logic "low" to logic "high" transition by the resistance/capacitance (RC) time constant.

Transistors 118, 120, 122, 124 are typically metal-oxide field effect transistors (MOSFETs) each having a first gate terminal coupled to a select signal S1, S2, S3, S4 respectively. These MOSFETs in this application are referred to as passgates. A second terminal of each passgate is coupled to the "A" bus side of one of the devices 110, 112, 114, 116, and a third terminal of each passgate is coupled to the other third terminals of the other passgates and to the "B" bus side of device 126.

In operation, a select signal is applied to the first gate terminal of one of the plurality of passgates, causing the on resistance from the second terminal to the third terminal to become low. Data to and from the device coupled to this passgate is thus passed through this low resistance to the bus B. The other unselected pass-gates are off, and have a high resistance from second to third terminals, blocking the data on the bus A lines coupled to these "off" passgates. A data path is thus established between one of the devices 110, 112, 114, 116 and device 126.

In a similar manner, applying a select signal to one of the other select lines S1, S2, S3, S4 creates a data path from the corresponding device to the bus B.

The logic "high" and "low" voltages and the transition times between these logic states are affected by the non-zero on resistance of the passgates, typically in a manner which degrades performance. For example, if device 110 is selected by a select signal S1 on passgate 118, when the active pulldown 104 is on, the low voltage applied to bus B is, by Ohm's Law, a function of the on resistance of active pulldown 104, the on resistance of passgate 118, and the resistance of bus pullup 106 associated with device 126. Any resistance added by passgate 118 causes the low voltage on bus B to be higher than it otherwise would be, thus reducing noise margins. When active pulldown 104 in device 110 goes to a high resistance indicative of a logic "high" on the bus, the low to high transition time on bus B is a function of passive pullup 106 associated with device 110, the on resistance of passgate 118, passive pullup 106 associated with device 126, and the capacitance of the parasitic capacitance represented by capacitors 104 associated with devices 110 and 126. The combination of added passgate resistance and non-isolated parasitic capacitances on both sides of the passgate significantly slows the low to high transition. In a similar manner, data passing in the other direction is also degraded.

Figure 2:
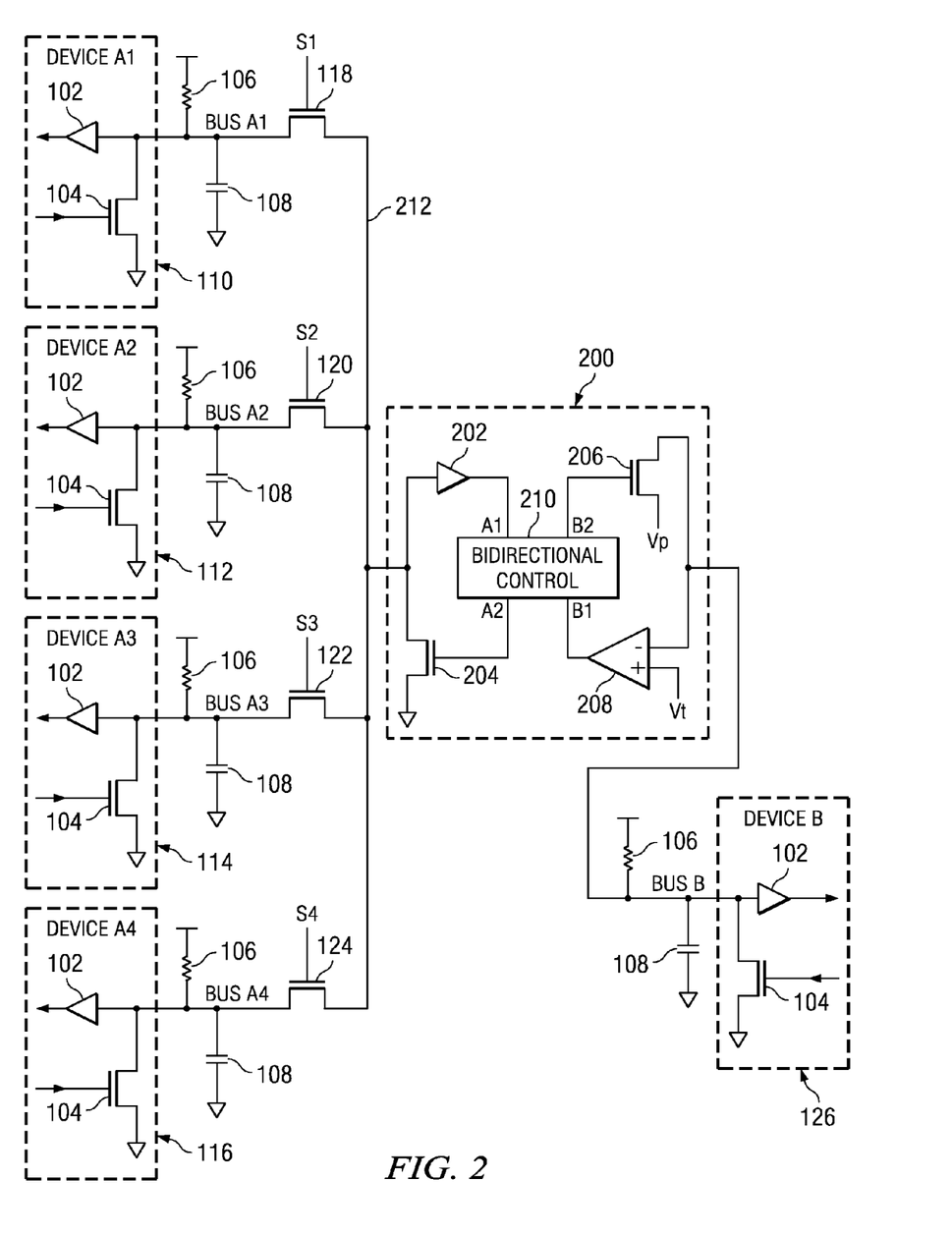
FIG. 2 is a block diagram of a 4 to 1 bidirectional multiplexer using passgates and having a bidirectional repeater.

In FIG. 2, a novel bidirectional repeater 200 is inserted between the common bus 212 of the plurality of passgates of the circuit of FIG. 1 and the device 126 on bus B. This bidirectional repeater comprises an inverting comparator 202, with a threshold typically midway between data low and data high voltage levels, having its input coupled both to common bus 212 and a first terminal of active pulldown 204, and its output coupled to a first terminal A1 of bidirectional control 210; active pulldown 204, with a first input coupled to bus 212 and the input of comparator 202, a second control terminal coupled to a second terminal A2 of bidirectional control 210, and a third terminal coupled to ground; active pulldown 206 having a first terminal coupled to bus B and the inverting input of a second comparator 208, a second control terminal coupled to a third terminal B2 of bidirectional control 210, and a third terminal coupled to a voltage Vp somewhat higher than ground; second comparator 208 having an inverting input coupled to bus B and the first terminal of active pulldown 206, a non-inverting input coupled to a threshold voltage Vt somewhat lower than the pulldown voltage Vp of active pulldown 206, and an output coupled to a fourth terminal B1 of bidirectional control 210; and bidirectional control circuit 210, having its four terminals coupled as described above.

In operation, one of the passgates 118, 120, 122, 124 is on, coupling one of the plurality of devices 110, 112, 114, 116 respectively to bus 212. For example presume that device 110 is coupled through passgate 118 to bus 212. Further presume initial conditions of both bus 212 and bus B at logic "high" voltage because active pulldowns in each device are off. When the output of device 110 is pulled low, the voltage on bus 212 becomes lower than the threshold of inverting comparator 202, causing the output of comparator 202 to go high. This logic "high" is coupled to input A1 of bidirectional control 210, in which logic causes an output on B2 of bidirectional control 210 which turns on active pulldown 206, causing a voltage Vp to be applied to device 126, which is interpreted as a logic "low" input by device 126. While active pulldown 206 is on, and if active pulldown 104 in device 126 is off, the output of comparator 208 remains at logic "low" because the Vp applied by active pulldown 206 to the inverting input is higher than the Vt present at the non-inverting input of comparator 208. The output of comparator 208 is coupled to input B1 of bidirectional control 210. Logic in bidirectional control 210 prevents the signal at input B1 from reaching output A2 as long as input A1 is at a logic "high" state, keeps active pulldown 204 turned off, and prevents data flow in the reverse direction (device 126 to device 110) if a "low" was first applied in the forward direction (device 110 to device 126). A logic "low" signal on bus 212, at a voltage between zero and the threshold voltage Vt of comparator 202, is thus repeated as a voltage of Vp at device 126. When the data level on bus 212 rises above the threshold Vt of inverting comparator 202, signifying the transmission of a data one, the output of comparator 202 goes low, causing through the logic in bidirectional control 210 the active pulldown 206 to turn off, at which time the pullup 106 associated with device 126 causes a logic "high" at the input of device 126. Data flow thus proceeds in this manner from device 110 to device 126.

When device 126 applies a logic "low" to bus B first, active pulldown 104 in device 126 causes the voltage at the input of inverting comparator 208 to go significantly lower than its threshold Vt, thus causing the output of comparator 208 to go high. This logic "high" voltage causes logic in bidirectional control 210 to turn on active pulldown 204, pulling bus 212 to near zero volts. At substantially the same time, logic in bidirectional control 210 prevents the signal at input A1 from reaching output B2 as long as input B1 is at a logic "high" state, keeps active pulldown 206 turned off, and prevents data flow in the forward direction (device 110 to device 126) if a "low" was first applied in the reverse direction (device 126 to device 110). In this manner, a logic "low" signal from device 126 applied to bus B, at a voltage between zero and the threshold voltage Vt of inverting comparator 208, is repeated as a voltage of near zero volts on bus 212. When the data level on bus B rises above the threshold of comparator 208, signifying the transmission of a data one, the output of comparator 208 goes low, causing through the logic in bidirectional control 210 the active pulldown 204 to turn off, at which time the pullup 106 associated with device 110 causes a logic "high" at the I/O terminal of device 110. Data flow thus proceeds in this manner from device 126 to device 110.

Through the action as described above of the bidirectional repeater, the parasitic capacitance 108 associated with device 126 and its bus line is decoupled from bus 212, and the parasitic capacitance associated with device 110 and its bus line is decoupled from bus B, decreasing the rise times of data low-to-high transitions. Voltage drop across the passgate is, however, still present.

In selecting the voltage Vp, described above as being somewhat higher than ground, and the voltage Vt, described above as being somewhat lower than Vp, the amount by which the respective voltage is, in the case of Vp, higher than ground, and, in the case of Vt, lower than Vp, is preferably chosen by the designer is by determining a satisfactory data transmission and reception for the embodiment, while maximizing noise immunity. This balance of considerations is well within the purview of those of ordinary skill in this art.

Figure 3:
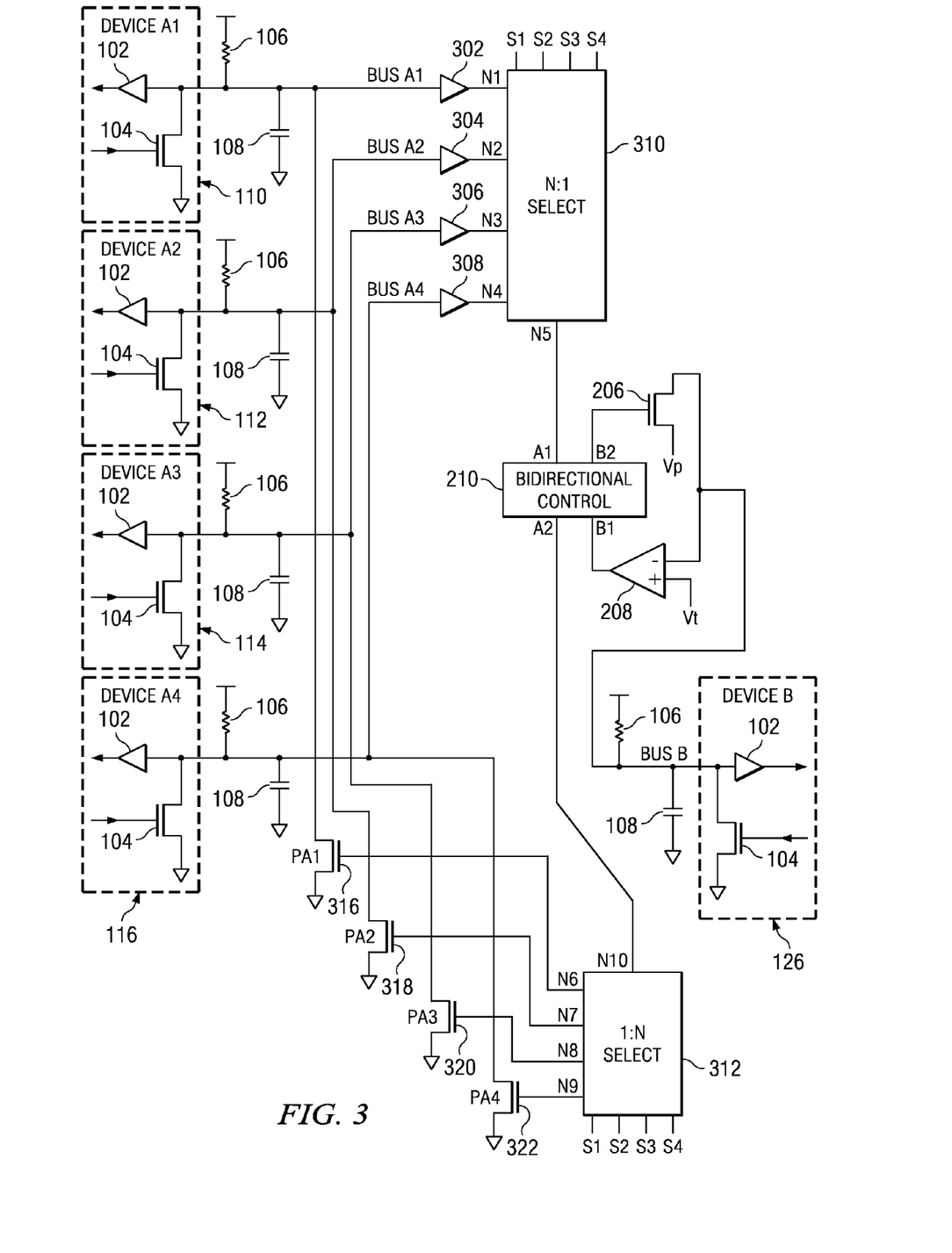
FIG. 3 is a block diagram of one embodiment of a 4 to 1 bidirectional multiplexer using bidirectional repeaters and providing data line selection (multiplexing) without passgates.

In FIG. 3, another embodiment is shown, in which the need for pass-gates is eliminated by a novel configuration of a plurality of inverting comparators and active pulldowns coupled through bidirectional control logic.

The I/O terminals of devices 110, 112, 114, 116 are coupled respectively to the inputs of inverting comparators 302, 304, 306, 308 and respectively also to the drains of active pulldowns 316, 318, 320, 322. The outputs of inverting comparators 302, 304, 306, 308 are coupled respectively to inputs N1, N2, N3, N4 of N:1 Select 310. The output N5 of N:1 Select 310 is coupled to a first input A1 of Bidirectional Control 210. The sources of active pulldowns 316, 318, 320, 322 are coupled to ground. The gates of active pulldowns 316, 318, 320, 322 are coupled respectively to outputs N6, N7, N8, N9 of 1:N Select 312. The input N10 of 1:N Select 312 is coupled to output A2 of Bidirectional Control 210. Output B2 of Bidirectional Control 210 is coupled to the gate of active pulldown 206, which has its source coupled to a voltage Vp and its drain coupled to bus B and the inverting input of comparator 208. The non-inverting input of comparator 208 is coupled to a voltage Vt which is lower than voltage Vp, and the output of comparator 208 is coupled to the input B1 of Bidirectional Control 210. Select signals S1, S2, S3, S4 are coupled respectively to the S1, S2, S3, S4 inputs of both N:1 Select 310 and 1:N Select 312.

In operation, the circuit of FIG. 3 is similar to the operation of the circuit of FIG. 2 described above, except that the single active pulldown 204 is replaced with a plurality of active pulldowns 316, 318, 320, 322, and the single inverting comparator 202 is replaced by a plurality of inverting comparators 302, 304, 306, 308. The output A2 of Bidirectional Control 210 is coupled to one of the active pulldowns 316, 318, 320, 322 through 1:N Select 312, dependent on which of the select lines S1, S2, S3, S4 is active. Similarly, one of the outputs of comparators 302, 304, 306, 308 is coupled to the A1 input of Bidirectional Control 210 through N:1 Select 310, dependent on which of the select lines S1, S2, S3, S4 is active. Signals on select lines to both the N:1 Select 310 and the 1:N Select 312 are the same, so that when inverting comparator 302 is selected, the corresponding active pulldown 316 is also selected, and so forth. Presuming the typically negligible delays through these N:1 Select and 1:N Select circuits, data flow in either direction is as described for the circuit of FIG. 2, with the select inputs S1, S2, S3, S4 determining which of the plurality of devices 110, 112, 114, 116 is coupled to bus B. The Bidirectional Control 210 operates as described above, precluding data flow in the opposite direction once a data "low" transmission has started.

Figure 4:
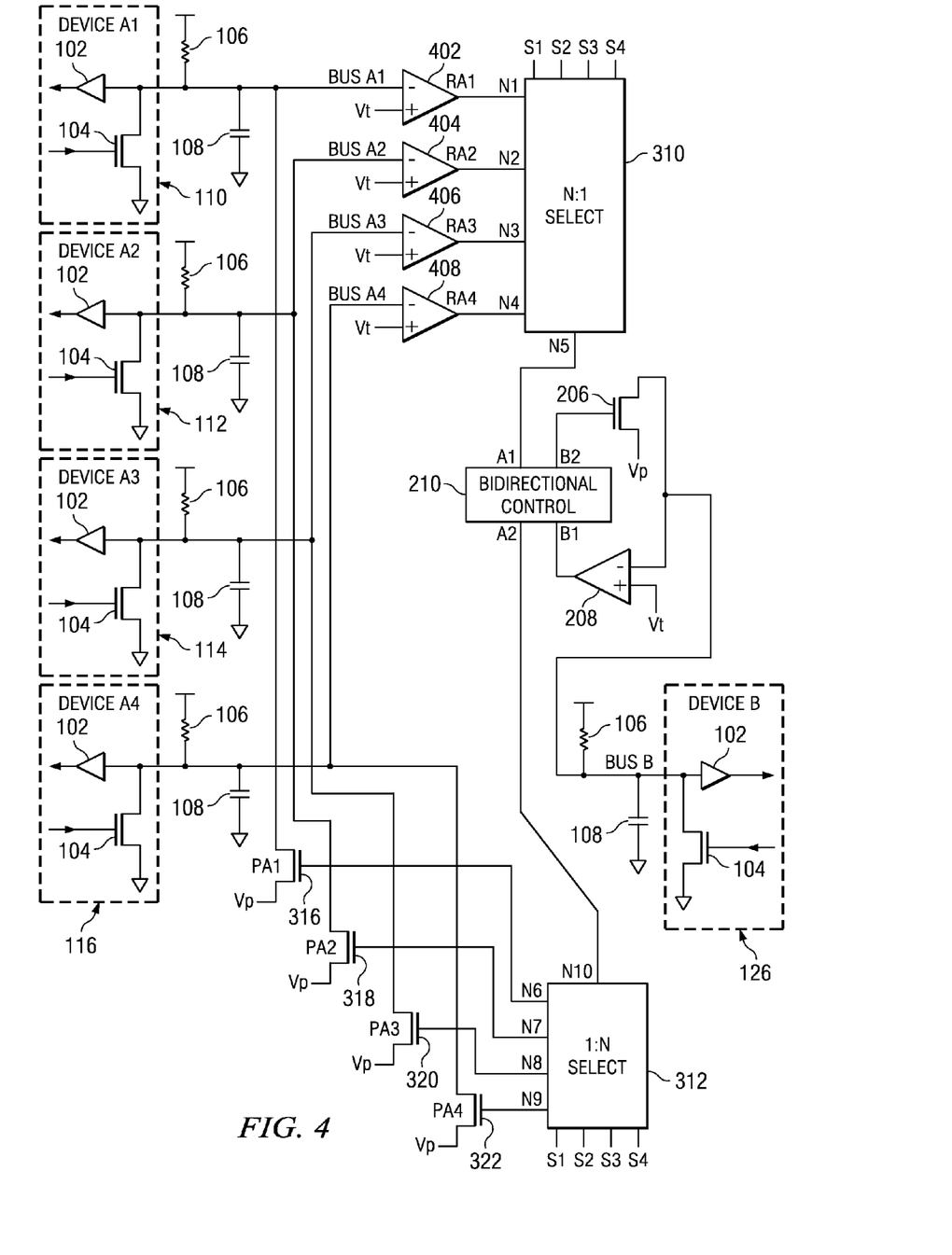
FIG. 4 is a block diagram of another embodiment of a 4 to 1 bidirectional repeater switch.

In FIG. 4, an embodiment similar to that shown in FIG. 3 uses a voltage Vt as the threshold voltage of inverting comparators 402, 404, 406, 408, and couples the source of each active pulldown 316, 318, 320, and 322 to a voltage Vp rather than ground. Characteristics of voltages Vt and Vp are as described above for FIG. 3, with Vp being a higher voltage than Vt. The I/O terminals of devices 110, 112, 114, 116 are coupled respectively to the inverting inputs of inverting comparators 402, 404, 406, 408 and respectively also to the drains of active pulldowns 316, 318, 320, 322. The non-inverting inputs of inverting comparators 402, 404, 406, 408 are coupled to a voltage Vt. The outputs of inverting comparators 402, 404, 406, 408 are coupled respectively to inputs N1, N2, N3, N4 of N:1 Select 310. The output N5 of N:1 Select 310 is coupled to a first input A1 of Bidirectional Control 210. The sources of active pulldowns 316, 318, 320, 322 are coupled to a voltage Vp. The gates of active pulldowns 316, 318, 320, 322 are coupled respectively to outputs N6, N7, N8, N9 of 1:N Select 312. The input N10 of 1:N Select 312 is coupled to output A2 of Bidirectional Control 210. Output B2 of Bidirectional Control 210 is coupled to the gate of active pulldown 206, which has its source coupled to a voltage Vp and its drain coupled to bus B and the inverting input of comparator 208. The non-inverting input of comparator 208 is coupled to a voltage Vt which is lower than voltage Vp, and the output of comparator 208 is coupled to the input B1 of Bidirectional Control 210. Select signals S1, S2, S3, S4 are coupled respectively to the S1, S2, S3, S4 inputs of both N:1 Select 310 and 1:N Select 312.

In operation, the circuit of FIG. 4 is similar to the operation of the circuit of FIG. 3 described above, except that the inverting comparators 402, 404, 406, 408 have a threshold of Vt rather than the more typical voltage midway between logic "high" and logic "low" voltages, and the sources of active pulldowns 316, 318, 320, 322 are coupled to voltage Vp which is above voltage Vt. The output A2 of Bidirectional Control 210 is coupled to one of the active pulldowns through 1:N Select 312, dependent on which of the select lines S1, S2, S3, S4 is active. Similarly, one of the outputs of inverting comparators 402, 404, 406, 408 is coupled to the A1 input of Bidirectional Control 210 through N:1 Select 310, dependent on which of the select lines S1, S2, S3, S4 is active. Presuming the typically negligible delays through these N:1 Select and 1:N Select circuits, data flow in either direction is as described for the circuit of FIG. 3, with the select inputs S1, S2, S3, S4 determining which of the plurality of devices on the a bus is coupled to bus B. The Bidirectional Control 210 operates as described above, precluding data flow in the opposite direction once a data "low" transmission has started.

For example, to logically couple device 110 to device 126, select lines S1, S2, S3, S4 are configured to couple the output of inverting comparator 402 through N:1 Select 310 and bidirectional control 314 to the gate of active pulldown 206. When the output of device 110 goes to logic "low", the voltage at the inverting input of inverting comparator 402 goes below threshold Vt, causing the comparator output to go "high". This logic "high", when coupled through N:1 Select 310 and bidirectional control 210 to the gate of active pulldown 206, turns on active pulldown 206, applying a voltage near Vp to device 126, which interprets it as a logic "low". Because Vp is above Vt, however, inverting comparator 208 is not triggered, thus avoiding turn on of any of the active pulldowns 316, 318, 320, 322 and so avoiding lockup. Similarly, when the output of device 126 goes to logic "low", the voltage at the inverting input of inverting comparator 208 goes below threshold Vt, causing the comparator output to go "high". This logic "high", when coupled through bidirectional control 210 and 1:N Select 312 to the gate of active pulldown 316, turns on active pulldown 316, applying a voltage near Vp to device 110, which interprets it as a logic "low". Because Vp is above Vt, however, inverting comparator 402 is not triggered, thus avoiding turn on of the active pulldown 206 and so avoiding lockup.

It will be understood by those skilled in the art that the topology of FIG. 4 may be further modified to couple the source of active pulldown 206 to ground, and the non-inverting input of inverting comparator 208 to a voltage midway between logic "high" and logic "low" levels. The use of pulldown voltage Vp on active pulldowns 316, 318, 320, 322 and threshold voltage Vt on inverting comparators 402, 404, 406, 408 precludes lockup even with active pulldown 206 coupled to ground and inverting comparator 208 having a midway threshold as described. It will also be recognized that operation without Bidirectional Control 210 is possible in certain cases. If the selected device from device 110, 112, 114, 116 and device 126 are configured to avoid contention, for example by testing the I/O terminal to determine that no other device is transmitting before initiating transmission, the function of Bidirectional Control 210 is not necessarily needed. In this case the output N5 of N;1 Select 310 is coupled to the gate of active pulldown 206, and the output of inverting comparator 208 is coupled to input N10 of 1:N Select 312.

Figure 5:
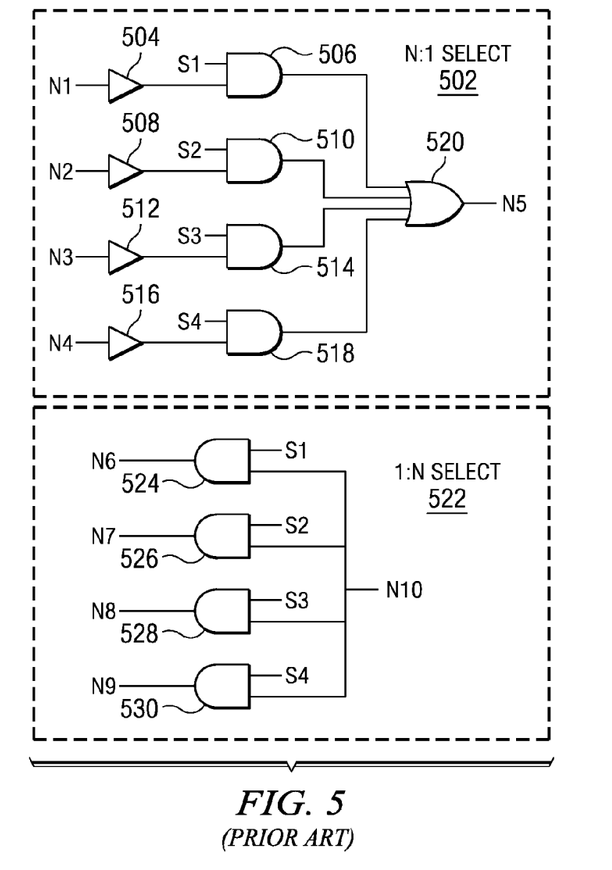
FIG. 5 (prior art) is a block diagram of one embodiment of N:1 and 1:N selection logic.

In FIG. 5, representative implementations of known N:1 Select and 1:N Select are shown. In FIG. 5a, signals at inputs N1, N2, N3, N4 are coupled respectively through buffers 504, 508, 512, 516 respectively to first inputs of AND gates 506, 510, 514, 518. Select signals S1, S2, S3, S4 are coupled respectively to the second inputs of AND gates 506, 510, 514, and 518. The outputs of AND gates 506, 510, 514, 518 are respectively coupled to four inputs of OR gate 520. The output of OR gate 520 is coupled to output terminal N5.

In operation, data signals present at one or more of N1, N2, N3, N4 are buffered and coupled to the four AND gates as described above. One of the four select signals S1, S2, S3, S4 is high at a given time, which allows the data present at the first input of AND gate having this high select signal to propagate to the output of the AND gate. All other AND gate outputs are low, since all have the select signal low. The data out of the selected AND gate then flows through OR gate 520, since all other inputs to the OR gate are low. The selected data input thus is coupled from one of inputs N1, N2, N3, N4 to output N5.

1:N Select 522 has a single data input signal coupled to input N10. This data signal from N10 is coupled to a first input of AND gates 524, 526, 528, 530. Each of the second inputs of AND gates 524, 526, 528, 530 are coupled respectively to select signals S1, S2, S3, S4. At any given time only one of the select signals is high, allowing data to pass from N10 to one of N6, N7, N8, N9 depending on which of select signals S1, S2, S3, S4 is high, respectively.

Figure 6:
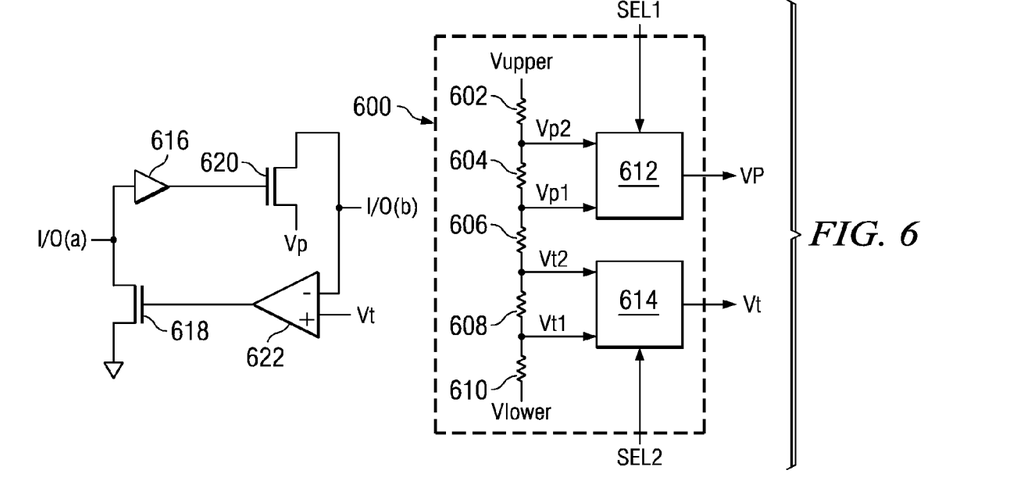
FIG. 6 is a block diagram of a bidirectional repeater having selectable threshold and pulldown voltages.

In FIG. 6, a bidirectional repeater comprises inverting comparator 616, with a threshold typically midway between data low and data high voltage levels, having its input coupled both to terminal I/O(a) and the drain of active pulldown 618, and its output coupled to the gate of active pulldown 620. The source of transistor 618 is coupled to ground. The drain of active pulldown 620 is coupled both to I/O(b) and the inverting input of comparator 622. The source of active pulldown 620 is coupled to a voltage Vp. The non-inverting input of comparator 622 is coupled to voltage Vt, and the output of comparator 622 is coupled to the gate of transistor 618.

Selectable voltage generator 600 comprises a resistive ladder having resistors 602, 604, 606, 608, 610 coupled in series, with the first terminal of resistor 602 coupled to a voltage Vupper, the second terminal of resistor 602 coupled to the first terminal of resistor 604 and to input Vp2 of switch 612, the second terminal of resistor 604 coupled to the first terminal of resistor 606 and to input Vp1 of switch 612, the second terminal of resistor 606 coupled to the first terminal of resistor 608 and to input Vt2 of switch 614, the second terminal of resistor 608 coupled to the first terminal of resistor 610 and to input Vt1 of switch 614, and the second terminal of resistor 610 coupled to voltage Vlower. Select input SEL1 is coupled to the select input of switch 612, and select input SEL2 is coupled to the select input of switch 614. The output Vt of switch 614 is coupled to the non-inverting input of comparator 622, while the output Vp of switch 612 is coupled to the source terminal of active pulldown 620.

In operation, voltage Vp is selected from Vp1 or Vp2 by applying a select signal to SEL1. Voltage Vt is selected form Vt1 or Vt2 by applying a select signal to SEL2. Because a resistive divider is used to create voltages Vt1, Vt2, Vp1, Vp2, and because voltage Vupper is greater than Vlower, it is assured that any voltage Vp is above any voltage Vt, as is desired for proper operation of the bidirectional repeater.

When the voltage on I/O(a) is pulled down signifying transmission of a logic "low" from a device connected to I/O(a), the voltage goes below the threshold of inverting comparator 616, causing the output of comparator 616 to go high, thus turning on active pulldown 620 and causing a voltage of approximately Vp to be applied to terminal I/O(b). This voltage Vp is interpreted as a logic "low" by a device connected to I/O(b). While active pulldown 620 is on, the output of comparator 622 remains at logic "low" because the Vp applied by active pulldown 620 to the inverting input is higher than the Vt present at the non-inverting input of the comparator. The output of comparator 622 is coupled to the gate of active pulldown 618, turning it off. In this manner, a logic "low" signal applied at I/O(a), at a voltage between zero and the threshold voltage of comparator 616, is repeated as a voltage of approximately Vp at I/O(b). When the data level at I/O(a) rises above the threshold of inverting comparator 616, signifying reception of a logic "high", the output of inverting comparator 616 goes low, causing active pulldown 620 to turn off, at which time the bus pullup associated with the device coupled to I/O(b) causes a logic "high" at the input of that device. During this logic "high" voltage on I/O(b), comparator 622 output is low, turning off active pulldown 618. Data flow thus proceeds in this manner from a device coupled to I/O(a) to a device coupled to I/O(b).

When a device coupled to I/O(b) applies a logic "low", the voltage at I/O(b) is significantly lower than the threshold Vt of comparator 622, thus causing the output of comparator 622 to go high which turns on active pulldown 618, applying a voltage near zero volts to I/O(a). When the data level at I/O(b) rises above the threshold Vt of comparator 622, the output of comparator 622 goes low, turning off active pulldown 618, at which time the bus pullup associated with the device coupled to I/O(a) causes a logic "high" at I/O(a). Data flow thus proceeds in this manner from I/O(b) to I/O(a).

Summarizing operation of the repeater in the case of both devices attempting to transmit a logic "low":

1. A device on I/O(a) pulls it low, comparator 616 then turns on pulldown 620, which pulls I/O(b) to Vp
2. A device on I/O(b) turns on and pulls I/O(b) further down, below Vt. This turns on pulldown 618.
3. The original device on I/O(a) stops transmitting low and shuts its pulldown off. I/O(a) is however, is still being held low by pulldown 618. This situation corresponds to an I2C slave signaling an acknowledgement to the master.
4. The device on I/O(b) stops transmitting low and shuts its pulldown off. The bus voltage at I/O(b) now rises back up to Vp.
5. Because the I/O(b) bus voltage is again above Vt, Comparator 622 shuts off pulldown 618.
6. I/O(a) voltage starts to rise, being pulled up by the external load resistor.
7. I/O(a) rises above the threshold of comparator 616, pulldown 620 is shut off, and now I/O(b) can rise all the way back up.

It will be apparent to those skilled in the art that any desired number of voltages Vt and/or Vp may be generated and selected as described above, increasing the number of select lines and switching elements correspondingly. Alternative means of insuring that any selected voltage Vp remains above any selected voltage Vt may also be applied. Where the example embodiments shown herein may have a specific number of devices on either side of the multiplexer (such as 4 to 1), it is apparent to those skilled in the art that alternative embodiments having M to N couplings are equally feasible.

It should further be understood that the use of Vdd, Vref, ground, etc., are illustrative only, and that implementations using single or dual power supplies and the like are equally possible. Moreover, reference voltages developed either internal to the circuit or external to the circuit will suffice. While field-effect and bipolar transistors have been shown in these embodiments, alternative topologies using field effect and bipolar transistors in differing topologies will provide substantially equivalent operation.

Those skilled in the art to which the invention relates will also appreciate that yet other substitutions and modifications can be made to the described embodiments, without departing from the spirit and scope of the invention as described by the claims below.

What is claimed is:

1. An N:1 bidirectional data multiplexer, comprising:
a plurality of N I/O terminals;
another I/O terminal;
a plurality of N data buffers each having an input coupled respectively to one of said plurality of N I/O terminals, and each having an output;
N:1 Select logic having N inputs and one output, each input coupled respectively to one said output of said N data buffers, and a plurality of select lines coupled respectively to select terminals, whereby the coupling between the selected input and the output is responsive to signals present on said select terminals;
a bidirectional control circuit having a first input coupled to said output of said N:1 Select logic, a first output, a second input, and a second output;
an inverting comparator, having an inverting input coupled to said another I/O terminal, an output coupled to said second input of said bidirectional control circuit, and a non-inverting input coupled to a voltage Vt, wherein said voltage Vt is high enough to be above a logic "low" voltage input to said another I/O terminal by the open-drain data transceiver coupled to said another I/O terminal;
a first transistor having a gate coupled to said first output of said bidirectional control circuit, a drain coupled to said another I/O terminal, and a source coupled to a voltage Vp, wherein said voltage Vp is low enough to appear as a low logic level at said another I/O terminal, yet is higher than voltage Vt so that said inverting comparator is not triggered when a logic "low" is present at one of said plurality of N I/O terminals;

1:N selection logic, having 1 input and N outputs, each output coupled respectively to one of said N outputs, and said plurality of select lines coupled respectively to said select terminals, whereby the coupling between said input and the selected output is responsive to signals present on said select terminals, and whereby further the N:1 and 1:N selection logic circuits are synchronized by coupling respective select terminals of the N:1 and 1:N logic circuits; and next N transistors, each respectively having a source coupled to ground, a gate coupled to one of said N outputs of said 1:N select logic, and a drain connected respectively to one I/O terminal of said plurality of N I/O terminals.

2. The apparatus of claim 1, wherein:

each of said N data buffers is replaced by an inverting comparator having one input coupled to a respective one of said plurality of I/O terminals, and the other input coupled to a voltage Vt;

each of said N transistors has its source coupled to a voltage Vp rather than ground;

wherein voltage Vt is high enough to differentiate between logic "low" and logic "high" voltage levels at the I/O terminal, but is below voltage Vp to preclude lockup.

3. The apparatus of claim 1, wherein:

the output of said N:1 Select is coupled to the gate of said first transistor; and the output of said inverting comparator is coupled to the input of said 1:N Select;

whereby said Bidirectional Control circuit is removed, and contention between forward and reverse data flow is handled by the devices so connected by the multiplexer.

4. A method for bidirectionally multiplexing data signals which comprises:

coupling a first data signal at a first I/O terminal A1 to the input of a first comparator and to the drain of a first transistor, said transistor coupling said drain to ground to when said transistor is turned on, and appearing as a high resistance when turned off;

coupling a next data signal at a next I/O terminal An to the input of a next comparator and to the drain of a next transistor, said transistor coupling said drain to ground to when said transistor is turned on, and appearing as a high resistance when turned off;

selecting, using a N:1 selector, one of the outputs of said first and next comparators and coupling said output through bidirectional control logic to the gate of a transistor having its source coupled to a voltage Vp and its drain coupled to a device on I/O terminal B;

comparing the data level at I/O terminal B with a threshold voltage Vt and generating a comparison output;

coupling said comparison output through bidirectional control logic to the input of a 1:N selector; and routing, using said 1:N selector, said comparison output as modified by said bidirectional control logic to the gate of one of said first transistor or said next transistor;

whereby data flow from the selected one of I/O terminals A1...An is repeated at I/O terminal B with a logic "low" level substantially equal to Vp, which is above Vt and avoids lockup;

whereby data flow from I/O terminal B is repeated to the selected one of I/O terminals A1...An with a logic "low" substantially equal to ground;

and whereby bidirectional control logic senses which direction data first flows, and blocks data flow in the reverse direction until first data flow is completed.

5. The method of claim 4, wherein bidirectional control logic is not used to control data flow; rather, alternative contention handling means are utilized by the system to control data flow.

6. The method of claim 4, which further comprises:

selecting an optimal Vp from a plurality of voltages;

selecting an optimal Vt from a plurality of voltages; and allowing through the selection means only those voltages Vp greater than Vt;

whereby coupling to the device at I/O terminal B is optimized, and lockup is avoided by keeping Vp greater than Vt for any selection.

* * * * *